(12) United States Patent
Van Den Brink

(10) Patent No.: US 6,600,944 B2
(45) Date of Patent: Jul. 29, 2003

(54) MAGNETIC RESONANCE METHOD AND APPARATUS

(75) Inventor: Johan Sameul Van Den Brink, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/938,380

(22) Filed: Aug. 24, 2001

(65) Prior Publication Data

US 2002/0024339 A1 Feb. 28, 2002

(30) Foreign Application Priority Data

Jul. 31, 2000  (EP) .............................. 00202727

(51) Int. Cl.[7] ............................... A61B 5/055

(52) U.S. Cl. ................. 600/410; 600/410; 382/128; 382/130; 382/131; 324/307; 324/309; 324/312

(58) Field of Search ............................ 600/410, 407; 382/128, 130, 131; 324/307, 309, 310, 312, 313, 314, 316, 317

(56) References Cited

U.S. PATENT DOCUMENTS

| 6,025,714 A | * | 2/2000 | Avram et al. | 324/309 |
| 6,239,599 B1 | * | 5/2001 | Zhou et al. | 324/309 |
| 6,275,037 B1 | * | 8/2001 | Harvey et al. | 324/309 |
| 6,448,771 B1 | * | 9/2002 | Harvey et al. | 324/307 |

* cited by examiner

Primary Examiner—Marvin M. Lateef
Assistant Examiner—Jeoyuh Lin
(74) Attorney, Agent, or Firm—John Vodopia

(57) ABSTRACT

A novel magnetic resonance method for two-dimensional or three-dimensional imaging of an examination zone is described, in which k-space is scanned at predetermined sampling positions. Magnetic resonance signals of a first data set over k-space and magnetic resonance signals of subsequent reduced data sets over part of k-space are acquired, and data of the subsequent reduced data sets are completed with data of the first data set in order to obtain a full image of the scanned object. The acquisition of data of the subsequent reduced data sets ($d_2$, $d_3$, $d_4$) will start or end with the highest value in k-space. Further a novel magnetic resonance apparatus and a computer program product are described, which are designed for performing the above mentioned method.

10 Claims, 3 Drawing Sheets

MAGNETIC RESONANCE METHOD AND APPARATUS

Figure 1:
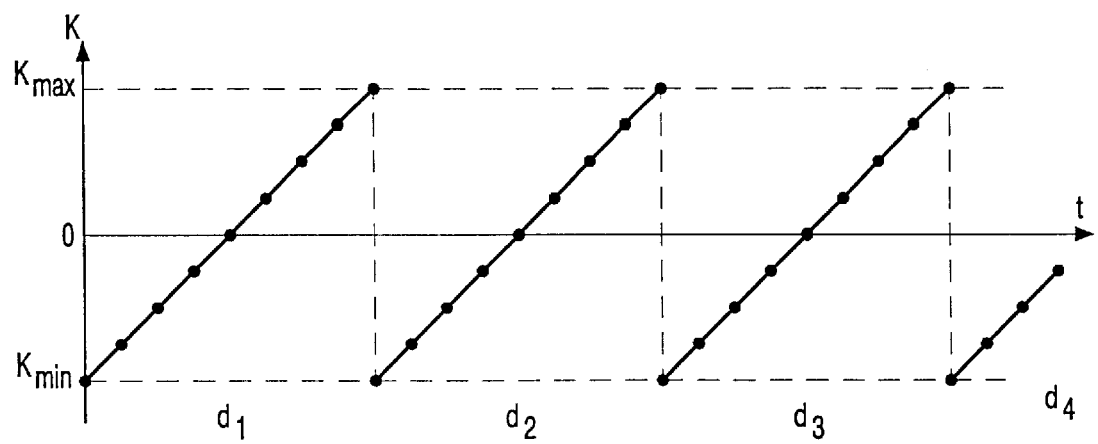

The invention relates to a magnetic resonance method for two-dimensional or three-dimensional imaging of an examination zone, in k-space is scanned at predetermined sampling positions according to the preamble of claim 1. The invention relates further to a magnetic resonance apparatus according to the preamble of claim 9 and to a computer program product according to the preamble of claim 10.

Normal acquisition schemes for magnetic resonance methods are as an example known from U.S. Pat. No. 5,498,961, which shows in FIG. 4 the progression in time when a plurality of sets of raw data are acquired, the gradient direction being plotted as the ordinate whereas the time is plotted as the abscissa. Each point in the diagram corresponds to the acquisition of a magnetic resonance signal. Since the MR signal per se is acquired during a finite period of time, which is negligibly small in relation to the total acquisition time for a complete set of raw data, a single magnetic resonance signal is symbolized by a point in the diagram. The distance in time between two successive points thus corresponds to the repetition time of the sequence. After a first set of raw data has been acquired in this manner, immediately a further measurement period commences, during which a second set of raw data is acquired, followed by a third set, etc. It is explicitly stated that within a measurement period any order of gradient may be chosen, however, it is necessary that this order in the second and the third measurement period shall be maintained.

On the other hand it is possible to diminish the acquisition time for a set of data by sharing the acquisition data of previous sets or scans, which is generally known as profile sharing. There are different known methods of profile sharing like the so called "keyhole method", wherein the central part of the k-space will be acquired more often because dynamics for instance for cardiac MR scans occur more in the central k-profiles. Profile sharing as such is also known under the names GES, FAST CARD, TRICKS etc. The basic principle of these acquisition schemes is that the k-space being divided in segments which are acquired with different frequencies, which acquisition segments will be combined with more often repeated central k-space profiles. In this manner the resolution in time between subsequent images can be improved.

The above mentioned acquisition schemes do have several drawbacks in that these profile sharing scans will only give a satisfactory result for dynamic scans. On the other hand the image data in the outer k-space will be defined once and for all, which may influence the resolution negatively.

It is an object of the present invention to improve the acquisition scheme in profile sharing that faster imaging in magnetic resonance will be available whereas problems like fold-over artefacts and/or ghosting and too low resolution will be suppressed to a great extent. A further object of the present invention is to provide a magnetic resonance apparatus and a computer program product designed for faster imaging while suppressing the forming of fold-over artefacts and/or ghosting.

The first object of the invention is accomplished by a magnetic resonance imaging method as defined in claim 1. The further objects of this invention are accomplished by a magnetic resonance apparatus according to claim 9 and by a computer program product according to claim 10.

The data acquisition according to the present invention has the main advantage that sampling will occur in the region of most interest, i.e where imaging is most important for statements of high relevance and quality. Another import feature of the present invention is that forming of artefacts or ghosting is suppressed to an essential extent.

Further advantages of the invention are disclosed in the dependent claims and in the following description in which an exemplified embodiment of the invention is described with respect to the accompanying drawings. It shows FIG. 1, the regular scanning of k-space according to the well-known acquisition scheme, FIG. 2, the as "keyhole" well-known regular acquisition scheme in k-space, FIG. 3, a first acquisition scheme according to the present invention, FIG. 4, a second acquisition scheme according to the invention, wherein the gradient directions for subsequent sets are reversed, FIG. 5, a third acquisition scheme with steeper gradients in the outer k-space, FIG. 6, a smoother acquisition scheme similar as the third acquisition scheme, and FIG. 7, another acquisition scheme similar as the third acquisition whereas the gradients in the outer k-space are stepwise steeper.

Specific numbers dedicated to elements defined with respect to a particular figure will be used consistently in all figures if not mentioned otherwise.

In FIG. 1 the regular acquisition scheme as described in U.S. Pat. No. 5,498,961 is depicted. The subsequent scanning sets $d_1$, $d_2$, $d_3$ and so forth are performed in exactly the same manner, i.e. the direction of the gradient dk/dt and its steepness remain constant for all scans. The value of k may be $|K_y|$, $|K_z|$ or $|K_y^2+K_z^2|$. But not only scans in linear direction in k-space but also spiral scans as e.g. described in U.S. Pat. No. 5,532,595 may be used. Every dynamic scan $d_1$, $d_2$, $d_3$ delivers a specific image after Fourier transformation.

Figure 2:
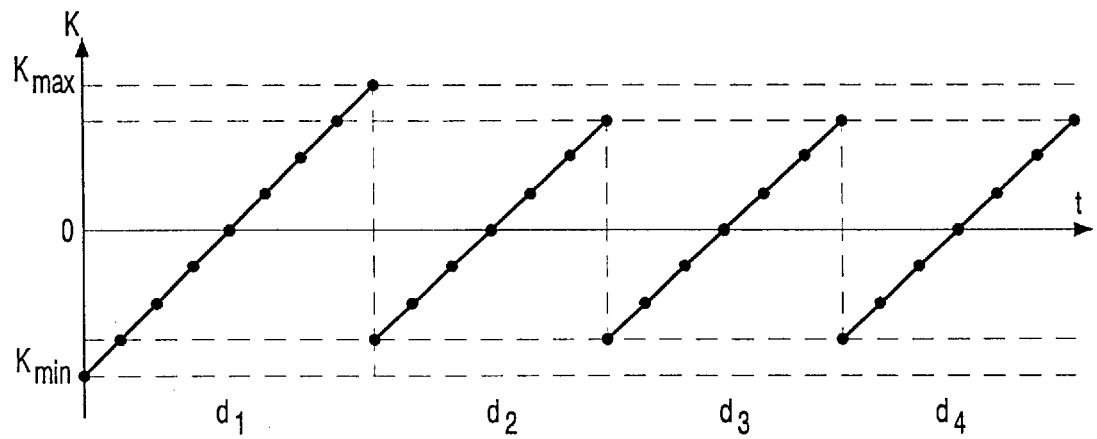

In FIG. 2 another regular acquisition scheme is shown, which is state of the art and is based on the principle, that in the first scan $d_1$ the k-space will be scanned in total and in the subsequent scans $d_2$, $d_3$ and so forth data will be acquired only in the inner k-space. In this acquisition scheme the time difference between successive k=0 acquisitions will be improved significantly, however, since the outer k-space will be scanned only once there will be no dynamic imaging of the skirt parts of the scanned object.

Figure 3:
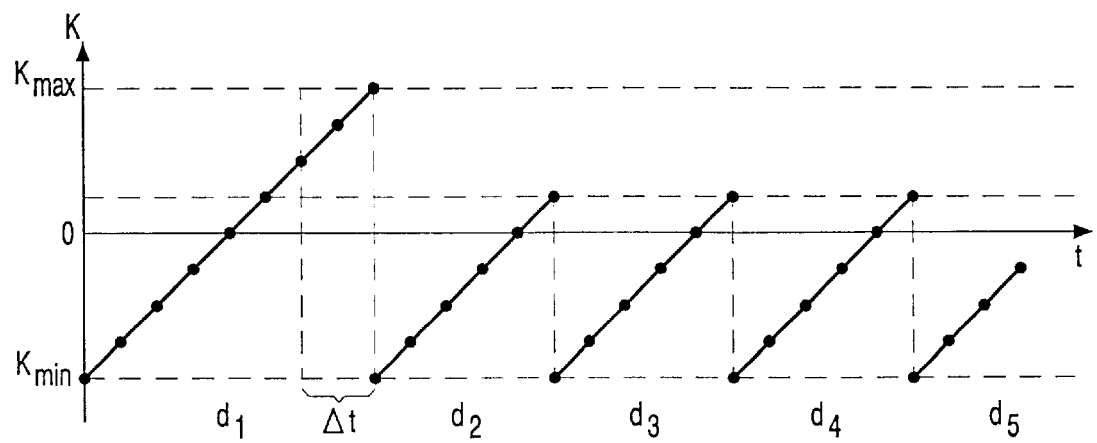

In FIG. 3 a first acquisition scheme according to the present invention is shown, wherein a first full scan $d_1$ is performed over the whole k-space and thereinafter scans $d_2$, $d_3$, $d_4$ and so forth are acquired from the minimum k-value $k_{min}$ to a k-value significant smaller than the maximum k-value $k_{max}$. The data acquired in the time period $\Delta t$ can be reused for further acquisitions as $d_2$, $d_3$, $d_4$ and so on. In principle a half scan is made in these subsequent scans which can be reconstructed by algorithms with improved Hermite conjugated polynomials, where data will be referenced to the measured data.

Figure 4:
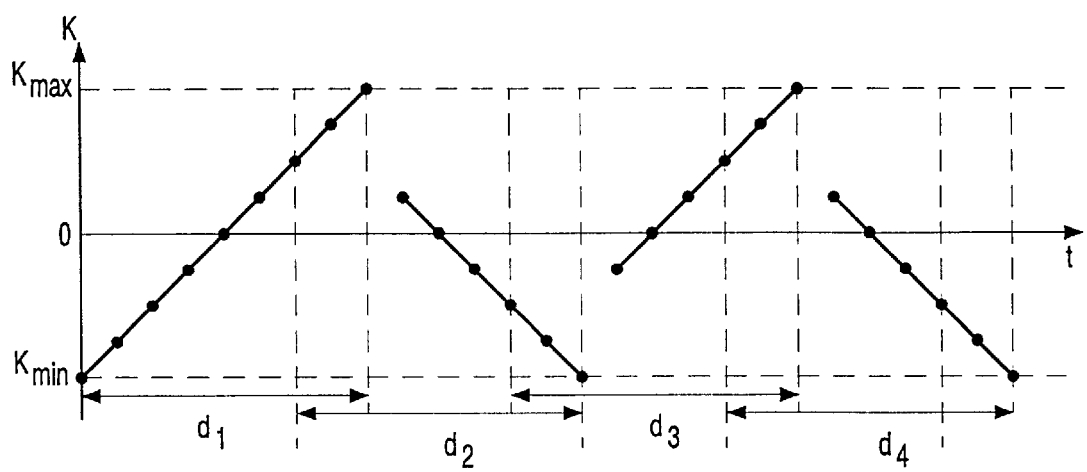

In FIG. 4 a second acquisition scheme is shown, wherein data are acquired in the first dynamic scan $d_1$ in a regular manner, whereas the second dynamic scan $d_2$ the gradient direction is inverted and the last data points of the first scan (here three measuring points) are used for imaging the next image. In the subsquent dynamic scans $d_3$ and $d_4$ the imaging will be proceeded in the same manner, thus every last measuring points of the previous scan will be used for the imaging of the next image. It should be clear that in this way almost no time efficiency will be lost.

Figure 5:
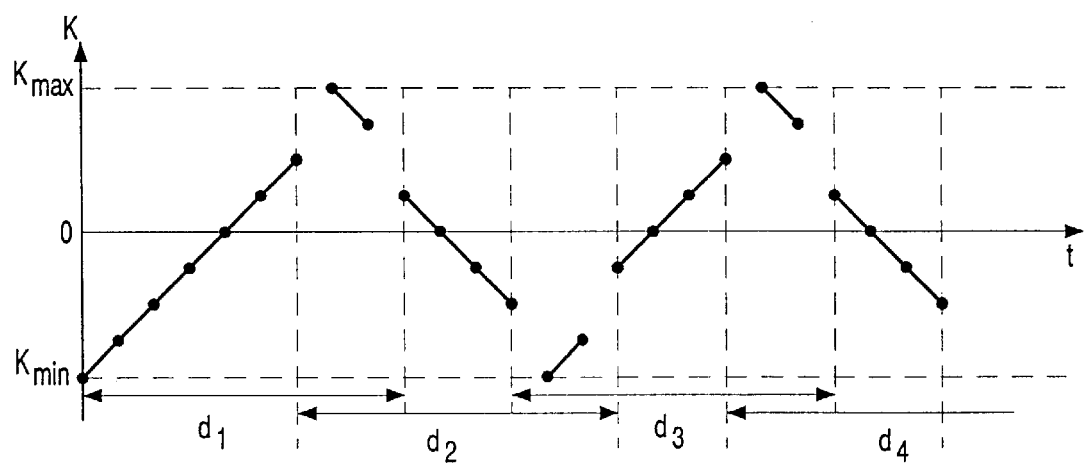

A further variation of the previous acquisition scheme is shown in FIG. 5, where the inversion of the gradient will be performed already before the maximum k-value $k_{max}$ will be reached. In fact at the end of the scanning period the last two k-values are measured by jumping directly to the maximum k-value $k_{max}$ after which the gradient direction will be reversed and the next smaller k-value will be acquired. Since the three measuring points of the previous scan $d_1$ will be used for the subsequent scan d the next k-value to be scanned is smaller than the k-value measured at last before the "jump" in scan $d_1$. In this way the number in discrete steps in scanning k-space for each set of data for every image are reduced so that the dynamic properties of the imaging will be maintained and the time resolution of the contrast in the images is significantly better than in the acquisition scheme according to the well-known method as described in relation to FIG. 2.

Figure 6:
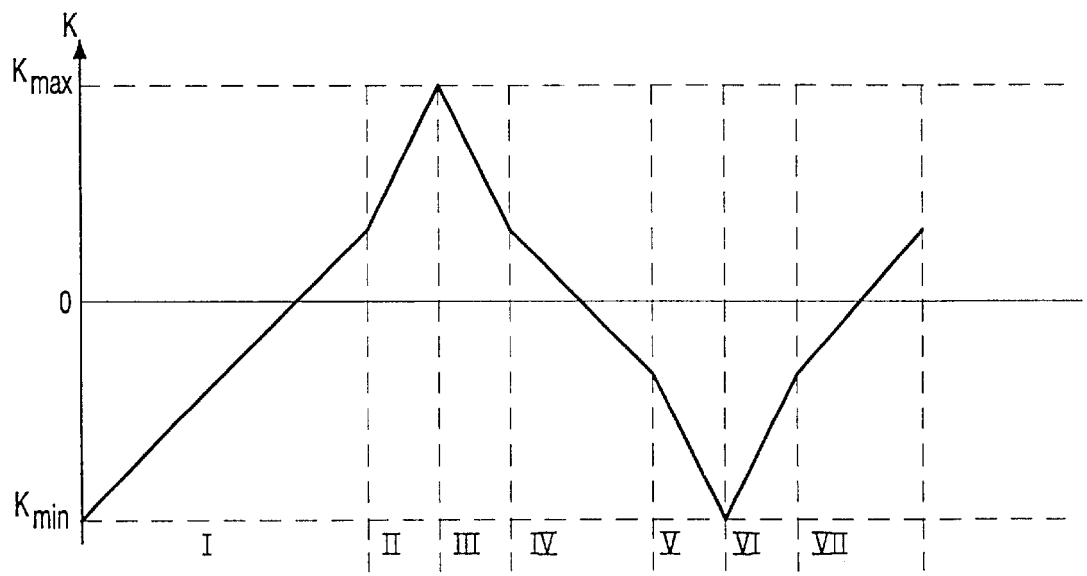

In FIG. 6 the above mentioned acquisition scheme has been further improved in that more data points will be acquired (schematically shown as a line, i.e. the points are nearer towards each other lying on the solid line) which gives a more smooth character of scanning. In fact the gradient in the different segments will be changed every time, i.e arctan |dk/dt| is different for the different segments I, II, III, IV, V, VI, VII and so forth. The first scan $d_1$ is then a combination of the measuring points in the segments I+II+III. The second scan $d_2$ is combined by the segments II+III+IV+V+VI etc (compare with scan d2 in FIG. 5). Generally speaking subsequent scans $d_3$, $d_4$ can be covered by the following time scheme: (II; III; IV; V; VI; VII)$_n$, in which as an example II and V comprise the even k-lines and III and VI comprise the odd k-lines. Of course the principle of segmentation can be enlarged to still more segments with all different gradients, i.e different arctan |dk/dt|. This method for data acquisition can also be used for cardiac phases and the like.

Figure 7:
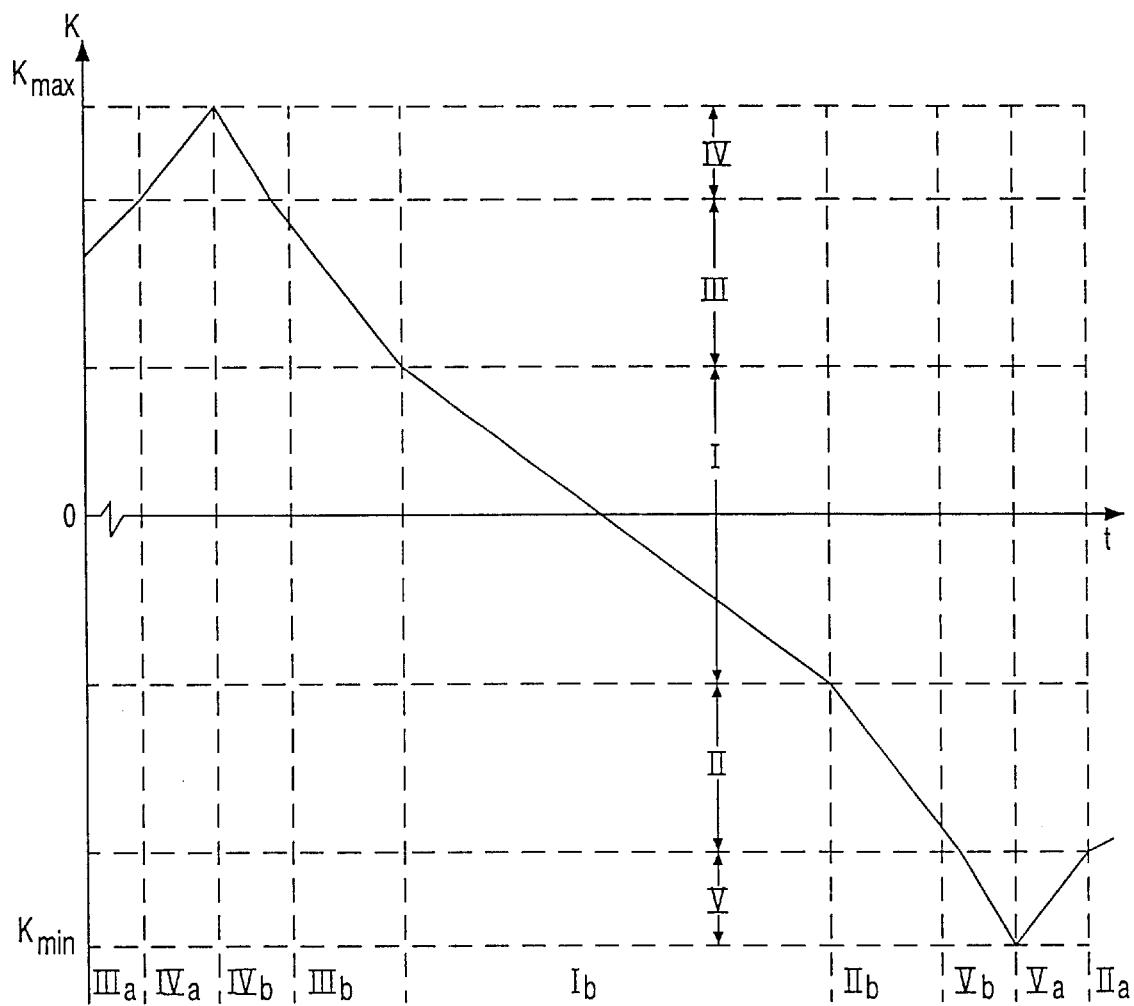

In FIG. 7 a further expansion to the scheme of FIG. 6 is depicted, where there is a segmentation in time regions and in k-regions. For the dynamic scans $d_1$, $d_2$, $d_3$ and so forth one can combine the data of the segments $IV_a$; $IV_b$; $III_b$; $I_b$; $V_b$, $V_a$; $II_a$; $I_a$; $III_a$; $III_b$; $I_b$ etc. in the manner as described before in relation with FIG. 6. In fact after the first run some segments (e.g. $IV_a$ and $IV_b$ in the aforementioned sequence) are skipped. As the gradient dk/dt varies over the segments less k-values are acquired for those segments with increased gradient. This leads to the need of combining outer segments further apart than segments in the vicinity of k=0 acquisitions. One could mention this acquisition scheme "running keyhole" since segments are left out not at fixed positions in k-space but in dependence of the importance of the part of the image and of the speed of change of the particular part within the scanned object. In other words, by segmenting more parts of the objects at the outer skirts are measured relatively less often.

Another option would be to segment parts of the outer k-space in another way, especially in the manner of sparse sampling. The idea of this sampling scheme is the following; if k-space is referenced from $k_{min}$ to $k_{max}$ from 0 to 20, the k-space can be divided into two segments A={0, 1, 4, 5, 8, 9, . . . } and B={2, 3, 6, 7, 10, 11, . . . }, which segments can be scanned according to the even/uneven lines increasingly or decreasingly. In this manner the outer part of the k-space can be sampled faster ("sampling time per segment") and at equal frequency of sampling of the original segment the time period between k=0 transits will be reduced.

The above described concept of segmentation is not only limited to the profiles in k-space but for every kind of image in magnetic resonance imaging and spectroscopy with different contents of information. The equivalence of dynamic scans and cardiac phases can be understood relatively simple. If one remembers flow measuring where flow coding gradients having reversed directions can be used. Often these gradients are introduced in an FFE sequence. In such a scheme still the high k-space lines can be sparsely sampled. In this aspect one can use the same scanning principle as mentioned in the previous paragraph. Otherwise one has to distinguish between general dynamic scans and cardiac phases, in that the first ones do not necessarily apply sensing of physiological signals such as the cardiac R-wave. In the latter case the scan have to be divided into time segments, i.e. simultaneous measurement of the EEC is needed to prevent disturbing artefacts.

In order to obtain the above mentioned acquisition schemes a magnetic resonance apparatus as generally has been described e.g in PCT application WO 99/54746 and which contents herewith is included by reference, can be used. In addition an electronic circuit for reconstruction of the reduced set of measuring signals in the same gradient direction of a plurality of receiver coils is provided within the electronic control of the magnetic resonance apparatus. In this control device a computer program is implemented having algorithms for the acquisition of subsequent time periods to be performed with a reduced set of measuring data in the same gradient direction according to the above mentioned acquisition schemes.

What is claimed is:

1. A magnetic resonance method for two-dimensional or three-dimensional imaging of an examination zone, in which k-space is scanned at predetermined sampling positions, magnetic resonance signals of a first data set over k-space are acquired, magnetic resonance signals of subsequent reduced data sets over part of k-space are acquired, and data of the subsequent reduced data sets are completed with data of the first data set in order to obtain a fill image of the scanned object, characterised in that the acquisition of data of the subsequent reduced data sets ($d_2$, $d_3$, $d_4$) will start or end with the highest value in k-space.

2. Magnetic resonance method according to claim 1, characterised in that the subsequent acquisitions ($d_2$, $d_3$, $d_4$) will begin with the highest k-value but will end at a lower k-value than in the first acquisition (FIG. 3).

3. Magnetic resonance method according to claim 1, characterised in that subsequent acquisitions ($d_2$, $d_3$, $d_4$) alternate between beginning of acquisition at a lower k-value and beginning of acquisition at the highest k-value (FIG. 4).

4. Magnetic resonance method according to claim 1, characterised in that the gradient direction in k-space will be alternated at subsequent acquisitions.

5. Magnetic resonance method according to claim 1, characterised that acquisition of data in the outer k-space regions (II, III) will be performed with a steeper gradient (dk/dt) than in the inner k-space region (I, IV) (FIG. 6).

6. Magnetic resonance method according to claim 5, characterised in that the k-space will be segmented and acquisition of any segment (I, II, III, IV, . . . ) in k-space will be performed with different gradients (dk/dt) and/or reversed directions for subsequent acquisition periods (FIG. 6).

7. Magnetic resonance method according to claim 6, characterised in that the gradients (dk/dt) in the outer segments of k-space will be chosen stepwise steeper.

8. Magnetic resonance method according to claim 6, characterised in that the outer segments of k-space further apart than the segments in the vicinity of the k=0 acquisitions are combined for imaging.

9. A magnetic resonance apparatus for obtaining magnetic resonance images of a part of a body using a method as claimed in claim 1 comprising input terminals for an arrangement of receiver coils, a body coil, means for measurement of a plurality of sets of magnetic resonance signals via the arrangement of receiver coils, means for reconstruction of a final image from a distance dependent sensitivity of the receiver coils and the plurality of sets of magnetic resonance signals measured, characterised in that the magnetic resonance apparatus comprises means for reconstruction of a reduced set of measuring signals, which start or end with the highest value in k-space.

10. Computer program product for two-dimensional or three-dimensional imaging of an examination zone for performing a method as claimed in claim 1, in which sets of raw data are successively acquired during a definite period of time in the same gradient direction in k-space, characterised in that algorithms are provided for the acquisition of subsequent time periods to be performed with a reduced set of measuring signals, which start or end with the highest value in k-space.

* * * * *